United States Patent
Park et al.

(10) Patent No.: US 10,868,165 B2
(45) Date of Patent: Dec. 15, 2020

(54) TRANSISTOR STRUCTURE WITH DEPLETION-MODE AND ENHANCEMENT MODE-DEVICES

(71) Applicant: NAVITAS SEMICONDUCTOR, INC., El Segundo, CA (US)

(72) Inventors: Pil Sung Park, Los Angeles, CA (US); Maher J. Hamdan, Lake Forest, CA (US); Santosh Sharma, Laguna Niguel, CA (US); Daniel M. Kinzer, El Segundo, CA (US)

(73) Assignee: NAVITAS SEMICONDUCTOR LIMITED, Dublin (IE)

( * ) Notice: Subject to any disclaimer, the term of this patent is extended or adjusted under 35 U.S.C. 154(b) by 0 days.

(21) Appl. No.: 16/391,670

(22) Filed: Apr. 23, 2019

(65) Prior Publication Data

US 2019/0326426 A1    Oct. 24, 2019

Related U.S. Application Data

(60) Provisional application No. 62/661,585, filed on Apr. 23, 2018.

(51) Int. Cl.
*H01L 29/778* (2006.01)
*H01L 29/423* (2006.01)
(Continued)

(52) U.S. Cl.
CPC ...... *H01L 29/7787* (2013.01); *H01L 29/0696* (2013.01); *H01L 29/2003* (2013.01);
(Continued)

(58) Field of Classification Search
CPC ........... H01L 29/7786; H01L 29/42356; H01L 29/7832
(Continued)

(56) References Cited

U.S. PATENT DOCUMENTS 4,549,336 A * 10/1985 Sheppard .............. H01L 27/088
257/402
4,612,560 A    9/1986 Dortu et al.
(Continued)

FOREIGN PATENT DOCUMENTS

| | | |
|---|---|---|
| JP | 2007027284 A | 2/2007 |
| JP | 2011181743 A | 9/2011 |
| JP | 2015122544 A | 7/2015 |

OTHER PUBLICATIONS

U.S. Appl. No. 16/391,731, "Final Office Action", dated Apr. 14, 2020, 8 pages.
(Continued)

*Primary Examiner* — Robert T Huber
(74) *Attorney, Agent, or Firm* — Kilpatrick Townsend & Stockton LLP

(57) ABSTRACT

A gallium nitride transistor includes a substrate on which a source region, a drain region, a drift region and a gate region are defined. The drift region extends between the source region and the drain region. The gate region includes a combination of enhancement-mode and depletion-mode devices that are positioned across the drift region and are used together to control charge density and mobility of electrons in the drift region with a relatively low threshold voltage ($V_{th}$). Enhancement-mode devices are formed using a P-type layer disposed on the substrate and coupled to a gate electrode.

19 Claims, 13 Drawing Sheets

(51) Int. Cl.
    *H01L 29/78* (2006.01)
    *H01L 29/40* (2006.01)
    *H01L 29/06* (2006.01)
    *H01L 29/205* (2006.01)
    *H01L 29/20* (2006.01)

(52) U.S. Cl.
    CPC .......... *H01L 29/205* (2013.01); *H01L 29/404* (2013.01); *H01L 29/42356* (2013.01); *H01L 29/7786* (2013.01); *H01L 29/7832* (2013.01)

(58) Field of Classification Search
    USPC .................. 257/192, 194, E29.252, E29.265
    See application file for complete search history.

(56) References Cited

U.S. PATENT DOCUMENTS

| | | | |
|---|---|---|---|
| 7,714,360 B2 | 5/2010 | Otsuka et al. | |
| 2011/0215379 A1 | 9/2011 | Ikoshi et al. | |
| 2014/0138704 A1 | 5/2014 | Tanaka et al. | |
| 2015/0162424 A1* | 6/2015 | Briere | H01L 29/778 257/194 |
| 2015/0249134 A1* | 9/2015 | Ostermaier | H01L 29/0649 257/76 |
| 2016/0035853 A1 | 2/2016 | Kaneko et al. | |
| 2017/0338316 A1 | 11/2017 | Yao et al. | |
| 2018/0138306 A1 | 5/2018 | Jeon et al. | |
| 2018/0197999 A1 | 7/2018 | Palacios et al. | |

OTHER PUBLICATIONS

U.S. Appl. No. 16/391,731, "Non-Final Office Action", dated Nov. 21, 2019, 9 pages.
U.S. Appl. No. 16/391,731, "Restriction Requirement", dated Jul. 22, 2019, 7 pages.
U.S. Appl. No. 16/391,731, Advisory Action, dated Jun. 29, 2020, 2 pages.
U.S. Appl. No. 16/391,731, Notice of Allowance, dated Jul. 23, 2020, 8 pages.

* cited by examiner

Cross-section D-D

TRANSISTOR STRUCTURE WITH DEPLETION-MODE AND ENHANCEMENT MODE-DEVICES

CROSS-REFERENCES TO RELATED APPLICATIONS

This application claims priority to U.S. provisional patent application Ser. No. 62/661,585, for "GALLIUM NITRIDE TRANSISTOR WITH IMPROVED TERMINATION" filed on Apr. 23, 2018 which is hereby incorporated by reference in entirety for all purposes. This application is related to concurrently filed and commonly assigned patent application for "GALLIUM NITRIDE TRANSISTOR WITH IMPROVED TERMINATION STRUCTURE" and U.S. Non-Provisional patent application Ser. No. 16/391,731 filed on Apr. 23, 2019, which is hereby incorporated by reference in its entirety for all purposes.

FIELD

The present invention relates generally to semiconductor devices and in particular to compound semiconductor devices.

BACKGROUND

In semiconductor technology, gallium nitride (GaN) is one compound semiconductor material that is used to form various devices, such as high power field-effect transistors, metal insulator semiconductor field effect transistors (MIS-FETs), high frequency transistors, high power Schottky rectifiers, and high electron mobility transistors (HEMTs). These devices can be formed by growing epitaxial layers on silicon, silicon carbide, sapphire, gallium nitride, or other substrates. Often, such devices are formed using a heteroepi-taxial junction of aluminum gallium nitride (AlGaN) and GaN. This structure is known to form a high electron mobility two-dimensional electron gas (2DEG) at the interface of the two materials. In some applications it may be desirable to control the charge density and mobility of electrons in the 2DEG with a structure exhibiting a relatively low gate leakage and a reduced negative gate bias requirement to turn off the device.

SUMMARY

In some embodiments a transistor comprises a compound semiconductor substrate, a source region formed in the substrate and a drain region formed in the substrate and separated from the source region. A drift region is formed in the substrate and extends between the source region and the drain region. A gate region is formed across the drift region and is configured to control a flow of electrons through the drift region. The gate region includes at least one depletion-mode structure and at least one enhancement-mode structure.

In some embodiments the at least one enhancement-mode structure includes a p-type layer. In various embodiments the gate region includes a plurality of depletion-mode structures and a plurality of enhancement-mode structures with each enhancement-mode structure including a separate p-type layer. In some embodiments the plurality of depletion-mode structures and the plurality of enhancement-mode structures are arranged across the drift region in an alternating sequence. In various embodiments the transistor further comprises a gate electrode that is electrically coupled to each separate p-type layer of each enhancement-mode structure of the plurality of enhancement-mode structures, and is electrically insulated from the drift region of the substrate of each depletion-mode structure of the plurality of depletion-mode structures.

In some embodiments the transistor further comprises a gate electrode that is electrically coupled to each separate p-type layer of each enhancement-mode structure of the plurality of enhancement-mode structures, and is electrically coupled to the drift region of the substrate of each depletion-mode structure of the plurality of depletion-mode structures forming a Schottky barrier. In various embodiments one or more field plates are electrically coupled to the gate electrode and are formed over the drift region, extending from the gate region towards the drain region. In some embodiments a threshold voltage for the transistor is between −10 Volts and −25 Volts.

In some embodiments a transistor comprises a compound semiconductor substrate, a source region formed in the substrate and a drain region formed in the substrate and separated from the source region. A gate region is positioned between the source region and the drain region, wherein the gate region includes at least one depletion-mode device and at least one enhancement-mode device.

In some embodiments a drift region is formed in the substrate and extends between the source region and the drain region wherein the gate region is configured to control a flow of electrons through the drift region. In various embodiments a gate electrode extends across the gate region. In some embodiments the gate region includes a plurality of enhancement-mode devices wherein each enhancement-mode device of the plurality of enhancement-mode devices includes a p-type layer that is coupled to the gate electrode.

In some embodiments the gate region includes a plurality of depletion-mode devices, wherein each depletion-mode device of the plurality of depletion-mode devices is positioned in-between two enhancement-mode devices such that the plurality of depletion-mode devices and the plurality of enhancement-mode devices are arranged in an alternating pattern. In various embodiments the gate electrode is electrically coupled to each p-type layer of each enhancement-mode device of the plurality of enhancement-mode devices and is electrically insulated from each depletion-mode device of the plurality of depletion-mode devices by a dielectric layer.

In some embodiments the gate electrode is electrically coupled to each p-type layer of each enhancement-mode device and is electrically coupled to each depletion-mode device to form a Schottky barrier. In various embodiments one or more field plates are electrically coupled to the gate electrode and are formed over the drift region, extending from the gate region towards the drain region.

In some embodiments a compound semiconductor transistor comprises a source, a drain and a gate positioned between the source and the drain and including a plurality of depletion-mode devices and a plurality of enhancement-mode devices. In various embodiments each enhancement-mode device of the plurality of enhancement-mode devices includes a p-type layer. In some embodiments the plurality of enhancement-mode devices and the plurality of depletion-mode devices are arranged in an alternating pattern having an enhancement-mode device positioned in-between two adjacent depletion-mode devices. In various embodiments a gate electrode is electrically coupled to the p-type layer of each enhancement-mode device of the plurality of enhancement-mode devices and is electrically coupled to a semiconductor substrate in a region of each depletion-mode device of the plurality of depletion-mode devices to form a plurality of Schottky barriers.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Certain embodiments of the present invention relate to GaN-based transistors that have channel control structures employing a combination of enhancement-mode and/or depletion-mode devices to control the charge density and mobility of electrons in the drift region with a relatively low threshold voltage ($V_{th}$). In some embodiments a combination of enhancement-mode and depletion-mode structures are positioned across the drift region and are used in combination to control electron flow through the drift region. Some embodiments of the present disclosure use enhancement-mode structures that include a P-type layer disposed on an AlGaN layer. Various embodiments use depletion-mode structures that are formed by applying an electric field over an AlGaN layer. Further embodiments use depletion mode structures that include a Schottky barrier formed between the gate electrode and an AlGaN layer. In further embodiments one or more isolation zones are formed within the drift region and are used to define 2DEG corridors within the drift region.

In order to better appreciate the features and aspects of GaN-based transistors having drift region control structures using various combinations of enhancement-mode and/or depletion-mode structures according to the present disclosure, further context for the disclosure is provided in the following section by discussing several particular implementations of semiconductor devices according to embodiments of the present disclosure. These embodiments are for example only and other embodiments can be employed in other semiconductor devices such as, but not limited to gallium-arsenide, indium-phosphide and other suitable types of semiconductor materials.

Figure 1:
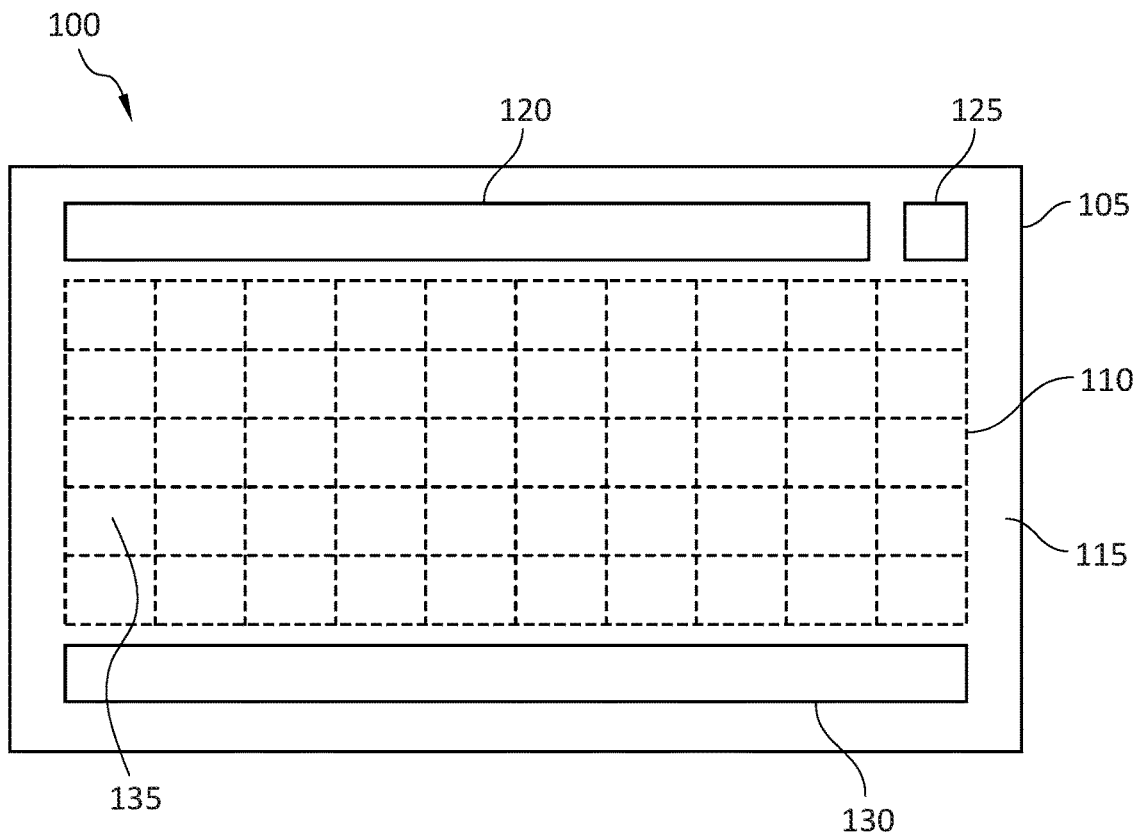
FIG. 1 illustrates a simplified plan view of a GaN-based semiconductor transistor according to an embodiment of the disclosure.

FIG. 1 illustrates a simplified plan view of a GaN-based semiconductor transistor 100. As shown in FIG. 1, transistor 100 is constructed on a substrate 105. Transistor 100 can have an active region 110 surrounded by an inactive region 115 that includes a source terminal 120, a gate terminal 125 and a drain terminal 130 that are used to form electrical connections to the transistor. Active region 110 can have one or more transistor "unit cells" 135 that are repeated across the active region, as discussed in greater detail herein. Transistor 100 is an illustrative example of a GaN transistor having a drift region control structure in accordance with embodiments of this disclosure, however, a person of skill in the art will appreciate that in other embodiments, GaN transistor 100 can have a size, shape and configuration different than the specific examples set forth herein and this disclosure is in no way limited to the examples set forth herein.

Figure 2:
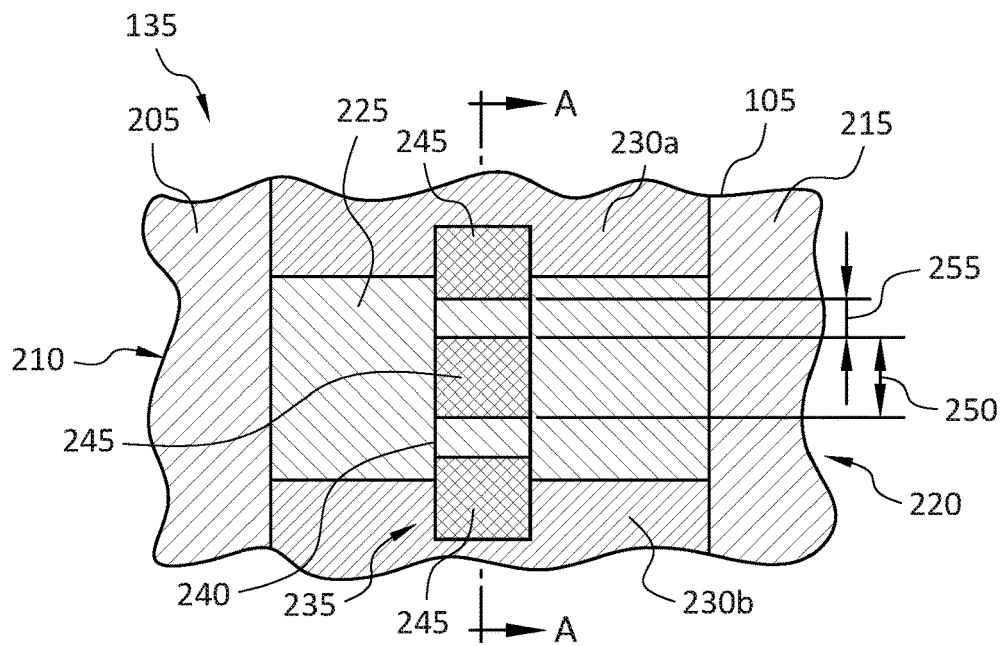
FIG. 2 illustrates a simplified plan view of a transistor unit cell of the GaN-based semiconductor transistor shown in FIG. 1.

FIG. 2 illustrates a simplified plan view of an example unit cell 135 of transistor 100 illustrated in FIG. 1. As shown in FIG. 2, unit cell 135 includes substrate 105 that includes a source region 205 at a first end 210, a drain region 215 at a second end 220 and a drift region 225 that extends between the source and drain regions. Drift region 225 is defined by isolation zones 230a, 230b that are disposed on either side of the drift region and extend between source region 205 and drain region 215. In some embodiments isolation zones 230a, 230b can be formed by implanting argon or other materials within the isolation zones. A gate region 235 is formed across drift region 225 (in a perpendicular orientation relative to the drift region) and is configured to control a flow of electrons through the drift region, as described in more detail below.

Gate region 235 includes a gate electrode 240 coupled to a plurality of P-type islands 245. Each P-type island 245 has a width 250 and a separation 255 from each adjacent P-type island. In some embodiments width 250 can be between 0.5 microns and 4 microns while in other embodiments the width can be between 0.75 to 2 microns and in one embodiment can be 1 micron or less. In some embodiments separation 255 can be between 100 nanometers and 1000 nanometers while in other embodiments the separation can be between 200 nanometers and 500 nanometers and in one embodiment can be approximately 300 nanometers. Although specific ranges for the width and spacing have been provided herein for this particular embodiment, one of skill in the art will appreciate that other embodiments can have different dimensions.

Figure 3A:
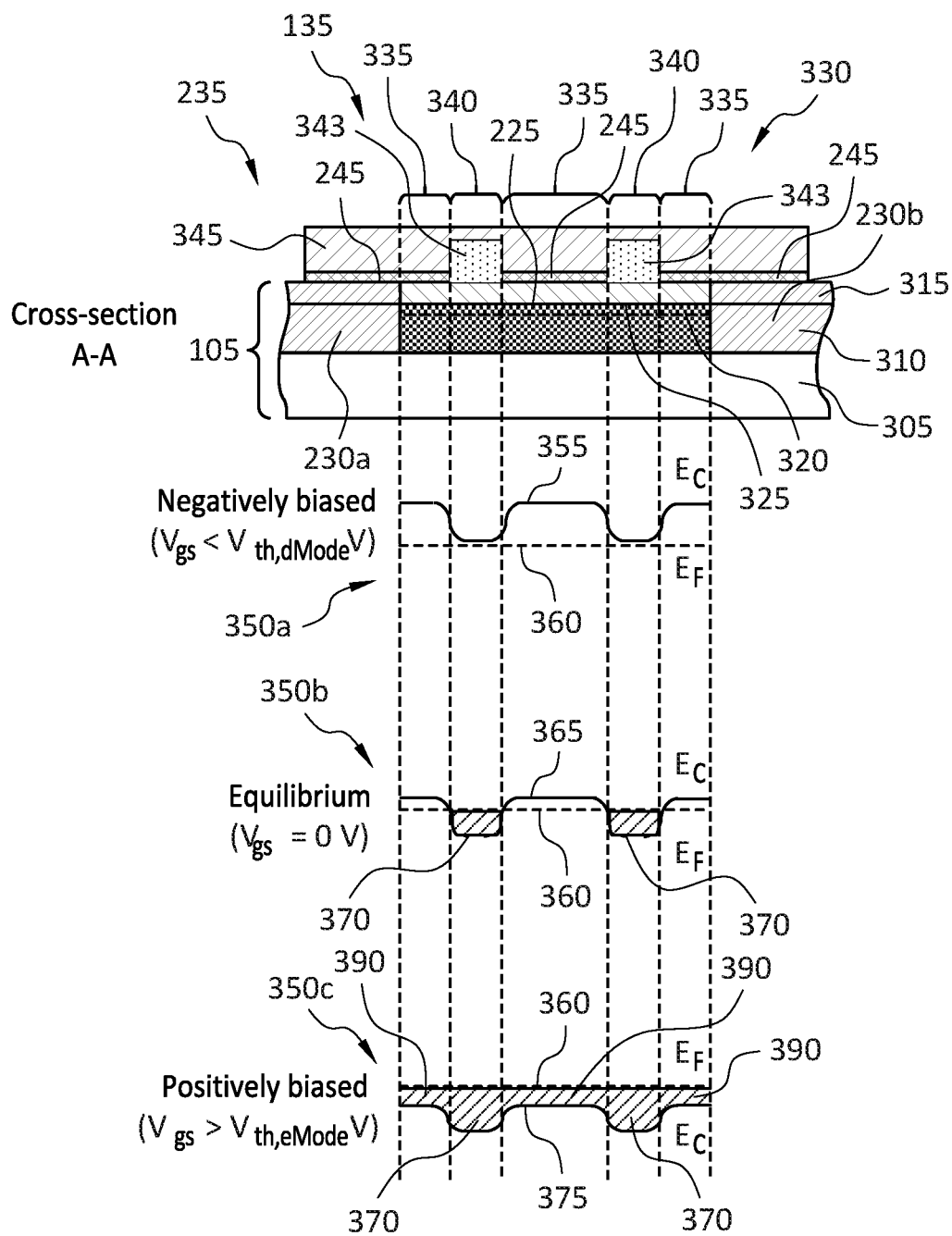
FIG. 3A illustrates a partial cross-sectional view across line A-A of the transistor unit cell illustrated in FIG. 2.

FIG. 3A illustrates a simplified cross-sectional view A-A of gate region 235 of unit cell 135 illustrated in FIG. 2. As shown in FIG. 3A, in some embodiments substrate 105 can include a first layer 305 that can include silicon carbide, sapphire, aluminum nitride or other material. A second layer 310 is disposed on first layer 305 and can include gallium nitride or other material. A third layer 315 is disposed on second layer 310 and can include a composite stack of other III nitrides such as, but not limited to, aluminum nitride, indium nitride and III nitride alloys such as aluminum gallium nitride and indium gallium nitride. In one embodiment third layer 315 is $Al_{0.20} Ga_{0.80} N$. In further embodiments any compound semiconductor material can be used, as described in more detail below.

In some embodiments, a two-dimensional electron gas (2DEG) region 320 is formed within substrate 105 along drift region 225 and enables electrons to flow between source region 205 (see FIG. 2) and drain region 215. In some embodiments 2DEG region 320 is positioned proximate an interface 325, between second layer 310 and third layer 315. 2DEG region 320 can be defined between isolation zones 230a, 230b that can be formed through second and/or third layers 310, 315, respectively. In some embodiments, 2DEG region 320 is induced by a combination of piezoelectric effect (stress), bandgap differential, modulation doping and/or polarization charge. For example, there may be a reduction in the conduction band at interface 325, where the conduction band drops below the fermi level to create a potential well that fills with electrons.

In some embodiments, 2DEG region 320 comprises AlGaN in a range, for example, of $Al_{0.25} Ga_{0.75} N$ about 20 nanometers thick. In alternative embodiments, the 2DEG region can comprise AlN, AlGaInN, or another material. In some embodiments, 2DEG region 320 comprises a thin barrier layer with high aluminum content and a thicker layer with less aluminum content. In some embodiments 2DEG region 320 can have a GaN cap layer while in other embodiments the 2DEG region does not have a GaN cap layer.

In some embodiments a drift region control structure 330 can be used to control the flow of electrons within 2DEG region 320 and can include plurality of P-type islands 245 that form enhancement-mode devices 335 and spaces between each P-type island that form depletion-mode devices 340, as described in more detail below. More specifically, enhancement-mode devices 335 and depletion-mode devices 340 are arranged in an alternating pattern across drift region 225. In some embodiments P-type islands 245 are disposed on third layer 315 of substrate 105 and can be formed using gallium nitride that is doped with a P-type dopant, that can be for example, magnesium. P-type islands 245 enable portions of drift region 225 to function as enhancement-mode devices 335 to control the flow of electrons through 2DEG region 320, as described in more detail herein.

A dielectric layer 343 can be formed on top of third layer 315 and in-between P-type islands 245. A gate electrode 345 can be formed on top of dielectric layer 343 and across P-type islands 245 such that the gate electrode is in ohmic contact with each P-type island. In some embodiments dielectric layer 343 can include silicon dioxide, silicon nitride or any other dielectric material. In various embodiments gate electrode 345 can be formed from titanium nitride, aluminum, nickel, platinum or any other metal having a suitable metal work-function.

Immediately below cross-section A-A are three graphical depictions of composite conduction band diagrams 350a, 350b, 350c for enhancement-mode devices 335 and depletion-mode devices 340 illustrated in cross-section A-A. Each band diagram 350a, 350b, 350c represents the state of each enhancement-mode device 335 and of each depletion-mode device 340 at each of three different bias conditions applied between gate electrode 345 and source region 205 (see FIG. 2).

First band diagram 350a illustrates a negative bias condition where a voltage applied between gate electrode 345 and source region 205 is less than a threshold voltage of depletion-mode devices 340. As shown, a conduction band 355 in the regions of depletion-mode devices 340 and the regions of enhancement-mode devices 335 are above a fermi level 360, so neither of the devices allow electrons to flow through gate region 235.

Second band diagram 350b illustrates an equilibrium bias condition where a voltage applied between gate electrode 345 and source region 205 is approximately 0 Volts. As shown, conduction band 365 drops below fermi level 360 in the regions of depletion-mode devices 340 creating d-mode potential wells 370 in 2DEG region 320. However, no potential wells are created in regions of enhancement-mode devices 335 so electrons are allowed to flow through gate region 235 in the depletion-mode device 340 regions but no electrons are allowed to flow in the enhancement-mode device 335 regions.

Third band diagram 350c illustrates an equilibrium bias condition where a voltage applied between gate electrode 345 and source region 205 is greater than the threshold voltage of the enhancement-mode devices 335. As shown, conduction band 375 drops below fermi level 360 in the regions of both enhancement-mode devices 335 and depletion-mode devices 340. D-mode potential wells 370 increase and e-mode potential wells 390 are created allowing electrons to flow across the entire width of gate region 235, reducing the on-resistance of transistor 100 (see FIG. 1).

Figure 3B:
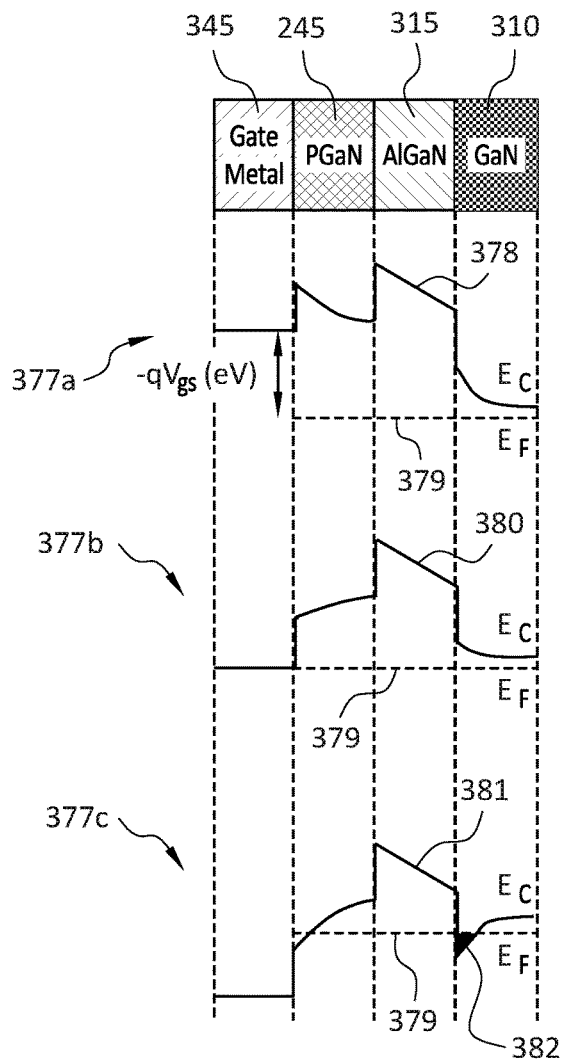
FIG. 3B illustrates the material stack and related conduction band diagrams for the enhancement-mode device in the transistor unit cell illustrated in FIG. 2.

FIG. 3B illustrates three conduction band diagrams 377a, 377b, 377c for the material stack of enhancement-mode device 335 described in FIG. 3A (for the same 3 bias conditions described in FIG. 3A). As shown in FIG. 3B, the material stack of enhancement-mode devices 335 includes GaN (second layer 310), AlGaN (third layer 315), P-type GaN 245 and gate electrode 345. Immediately below the material stack are three band diagrams 377a, 377b, 377c for enhancement-mode device 335. Each diagram represents the function of enhancement-mode device 335 at each of three different bias conditions applied between gate electrode 345 and source region 205. First band diagram 377a illustrates a negative bias condition where a voltage applied between gate electrode 345 and source region 205 is less than a threshold voltage of depletion-mode devices 340. As shown, a conduction band 378 is above a fermi level 379, so enhancement-mode devices 335 block current flow through gate region 235.

Second band diagram 377b illustrates an equilibrium bias condition where a voltage applied between gate electrode 345 and source region 205 is approximately 0 Volts. As shown, similar to the previous conduction band diagram 377a, a conduction band 380 is above fermi level 379, so enhancement-mode devices 335 block current flow through gate region 235.

Third band diagram 377c illustrates a positive bias condition where a voltage applied between gate electrode 345 and source region 205 is greater than the threshold voltage of the enhancement-mode devices 335. As shown, conduction band 381 drops below fermi level 379 creating e-mode potential wells 382 that allow electrons to flow through enhancement-mode device 335 regions of gate region 235.

Figure 3C:
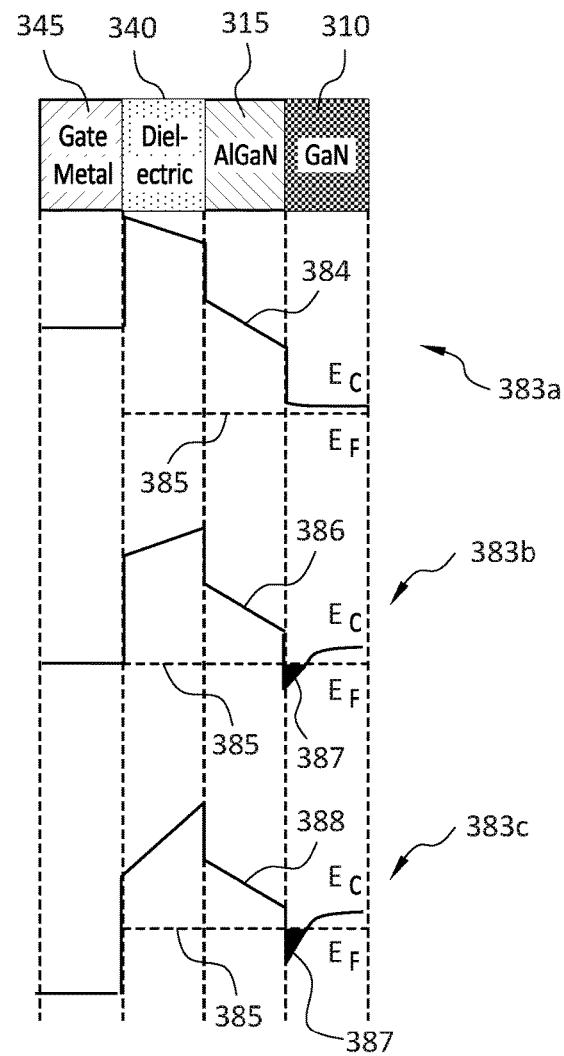
FIG. 3C illustrates the material stack and related conduction band diagrams for the depletion-mode device in the transistor unit cell illustrated in FIG. 2.

FIG. 3C illustrates three conduction band diagrams 383a, 383b, 383c for the material stack of depletion-mode device 340 described in FIG. 3A (for the same 3 bias conditions described in FIG. 3A). As shown in FIG. 3C, the material stack of depletion-mode devices 340 includes GaN (second layer 310), AlGaN (third layer 315), dielectric 343 and gate electrode 345. Immediately below the material stack are three band diagrams 383a, 383b, 383c for depletion-mode device 340. Each diagram represents the function of depletion-mode device 340 at each of three different bias conditions applied between gate electrode 345 and source region 205. First band diagram 383a illustrates a negative bias condition where a voltage applied between gate electrode 345 and source region 205 is less than a threshold voltage of depletion-mode devices 340. As shown, a conduction band 384 is above a fermi level 385, so depletion-mode devices 340 block current flow through gate region 235.

Second band diagram 383b illustrates an equilibrium bias condition where a voltage applied between gate electrode 345 and source region 205 is approximately 0 Volts. As shown, conduction band 386 drops below fermi level 385 creating d-mode potential wells 370 that allow electrons to flow through depletion-mode device 340 regions of gate region 235.

Third band diagram 383c illustrates a positive bias condition where a voltage applied between gate electrode 345 and source region 205 is greater than the threshold voltage of the enhancement-mode devices 335. As shown, conduction band 388 drops further below fermi level 385 creating a deeper d-mode potential wells 370 that reduces the on resistance of transistor 100 (see FIG. 1).

A person of skill in the art will appreciate that, although transistor 100 illustrated in FIGS. 1-3C is designed to function in the range of 10 Volts to 40 Volts, that with appropriate modifications a similar construction based on the features disclosed herein can function in the range of 100 millivolts to over 1200 Volts. Further, the judicious use of field plates and/or asymmetric architectures, as discussed in more detail below, can be used to make transistor 100 operate at different voltages.

As described above, the transistor structures described herein can be formed using any suitable compound semiconductor material. In some embodiments, any compound semiconductor material that employs heteroepitaxial junctions to form a 2DEG layer may be suitable. For example, suitable compound semiconductor materials can include, for example, all III-V compounds including but not limited to, III-Nitride, III-Arsenide, III-Phosphide, III-Oxide, and III-Antimonide. Other suitable compound semiconductor materials can include any II-VI compound, or any compound that can be used to create a HEMT and/or a MESFET.

In further embodiments the 2DEG as described above can be a 2-dimensional hole gas (2DHG), a 3-dimensional electron slab (3DES) and/or a 3-dimensional hole slab (3DHS).

Figure 4A:
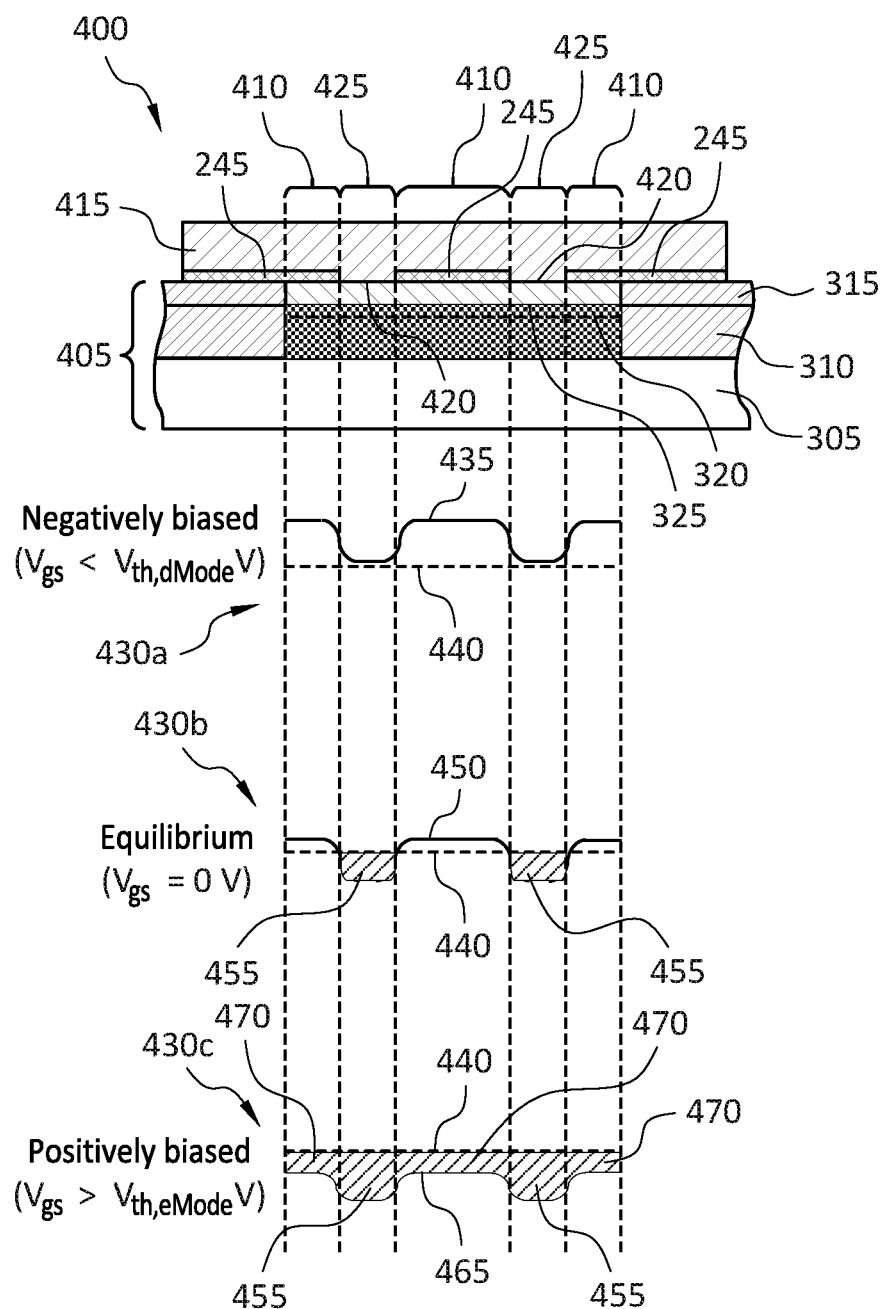
FIG. 4A illustrates a partial cross-sectional view of a transistor unit cell according to an embodiment of the disclosure.
Figure 4B:
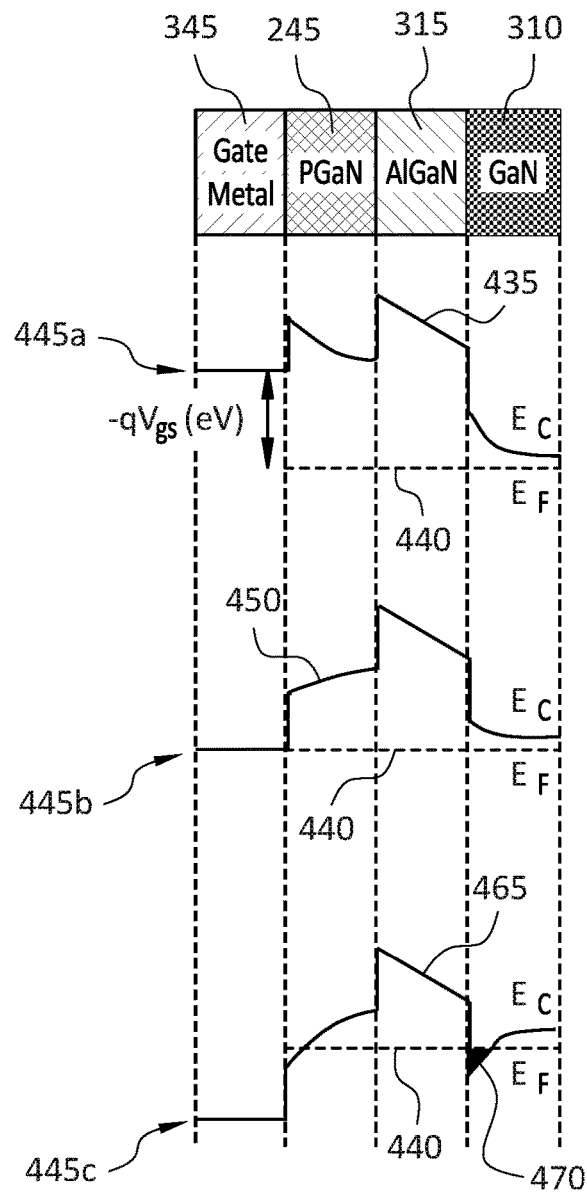
FIG. 4B illustrates the material stack and related conduction band diagrams for the enhancement-mode device in the transistor unit cell illustrated in FIG. 4A.
Figure 4C:
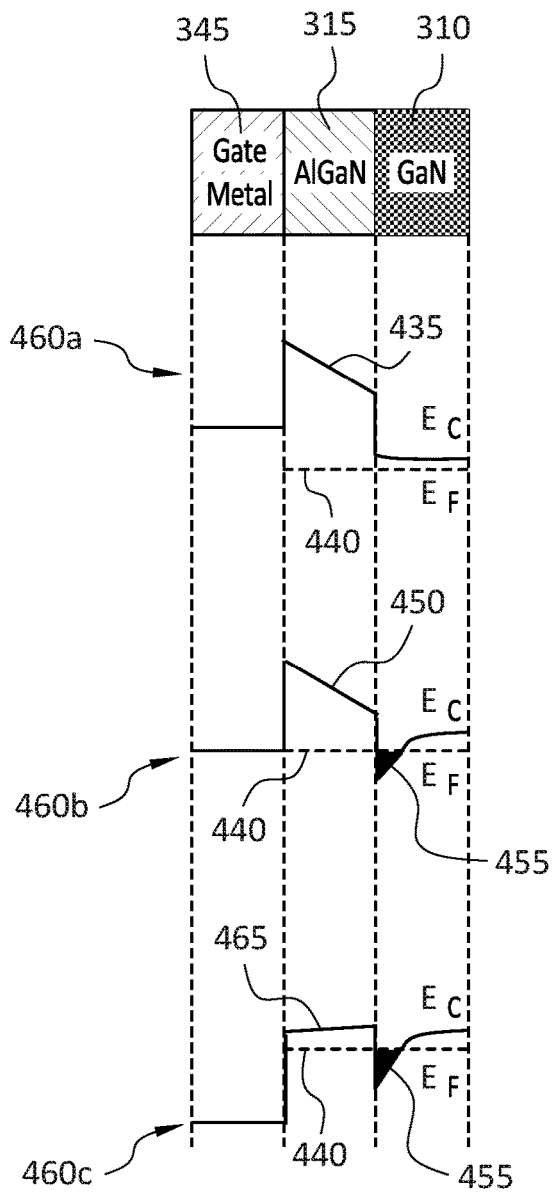
FIG. 4C illustrates the material stack and related conduction band diagrams for the depletion-mode device in the transistor unit cell illustrated in FIG. 4A.

FIGS. 4A-4C illustrate a cross-section of another embodiment of a transistor 400 that is similar to transistor 100 illustrated in FIGS. 2-3C (with like numbers referring to like elements), however transistor 400 does not have dielectric layer 343 so gate electrode 345 forms a Schottky barrier with substrate 405 in-between P-type islands 245. As shown in FIG. 4A, transistor 400 includes p-type islands 245 that form enhancement-mode devices 410 and gate electrode 415 contacts third layer 315 of substrate 405 to form Schottky barrier contacts 420 which are depletion-mode devices 425.

FIG. 4A illustrates a cross-section of transistor 400, FIG. 4B illustrates a material stack and related conduction band diagrams for enhancement-mode devices 410 and FIG. 4C illustrates a material stack and related conduction band diagrams for depletion-mode devices 425 within the transistor. Each of FIGS. 4A-4C include conduction band diagrams for each of three separate bias conditions, similar to the bias conditions described in FIGS. 3A-3C. In the following description the discussion of the conduction band diagrams will be arranged by bias condition, such that each "row" of FIGS. 4A-4C will be discussed together.

First row of band diagrams 430a, 445a, 460a illustrate a negative bias condition where a voltage applied between gate electrode 345 and source region 205 is less than a threshold voltage of depletion-mode devices 425. As shown, a conduction bands 435 in the regions of both depletion-mode devices 425 and the regions of enhancement-mode devices 410 are above a fermi level 440, so neither of the devices allows electrons to flow through source region 205 (see FIG. 2).

Second row of band diagrams 430b, 445b, 460b illustrate an equilibrium bias condition where a voltage applied between gate electrode 345 and source region 205 is approximately 0 Volts. As shown, conduction band 450 drops below fermi level 440 in the regions of depletion-mode devices 425 creating d-mode potential wells 455 that allow electrons to flow through gate region 235 in the depletion-mode device regions. However no potential wells are created in regions of enhancement-mode devices 410 so no electrons are allowed to flow in the enhancement-mode device regions.

Third row of band diagrams 430c, 445c, 460c illustrate a positive bias condition where a voltage applied between the gate and source is greater than the threshold voltage of the enhancement-mode devices 410. As shown, conduction band 465 drops below fermi level 440 in the regions of both enhancement-mode devices 410 and depletion-mode devices 425. D-mode potential wells 455 deepen and e-mode potential wells 470 are created allowing electrons to flow across the entire width of gate region 235, reducing the on-resistance of transistor 400.

In some embodiments the structure described above may result in a threshold voltage of approximately −0.5 Volts to −1.0 Volts for transistor 400 due to the barrier material, the barrier metal thickness and the Schottky metal species. In some embodiments, the threshold voltage can vary from lower than −1.0 Volts to higher than −0.5 Volts which have different combinations of barrier material, thickness and Schottky metal. In some embodiments a width of each Schottky barrier contact can be in the range of tens of nanometers to several microns, however one of skill in the art will appreciate that other suitable widths can be used and are within the scope of this disclosure. In further embodiments the contact metal for the Schottky barrier is aluminum, however other suitable metals can be used and in other embodiments a dielectric layer can be positioned between the metal and the substrate.

Figure 5:
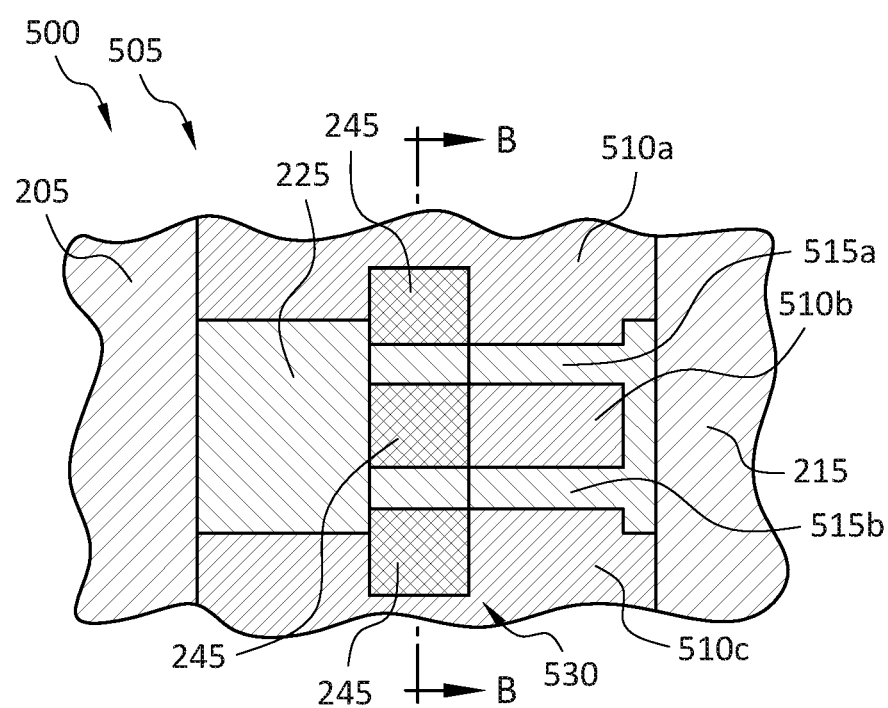
FIG. 5 illustrates a simplified plan view of a transistor unit cell of a GaN-based semiconductor transistor according to an embodiment of the disclosure.

FIG. 5 illustrates a simplified plan view of an example unit cell 500 of a transistor 505 that is similar to transistor 100 illustrated in FIGS. 1-3C (with like numbers referring to like elements), however in this embodiment drift region 225 includes isolation zones 510a, 510b, 510c disposed under P-type islands 245. Isolation zones 510a, 510b, 510c do not allow the 2DEG region to form, preventing the flow of electrons in those regions. In-between drift region isolation zones 510a, 510b, 510c are corridors 515a, 515b that allow electrons to flow through 2DEG region 520, as described in more detail below. Therefore the function of P-type islands 245 in this embodiment is to extend a lateral field into the 2DEG corridors 515a, 515b when under a negative bias to help shut off electron flow in the corridors.

Unit cell 500 includes a semiconductor substrate 525 that includes a source region 205 at a first end, a drain region 215 at a second end and a drift region 225 that extends between the source and drain regions. Drift region 225 is defined by isolation zones 510a, 510c that are disposed on either side of the drift region and extend between source region 205 and drain region 215. A gate region 530 is formed across drift region 225 and is configured to control a flow of electrons through the drift region. Gate region 530 includes a gate electrode 415 coupled to a plurality of p-type islands 245.

Figure 6:
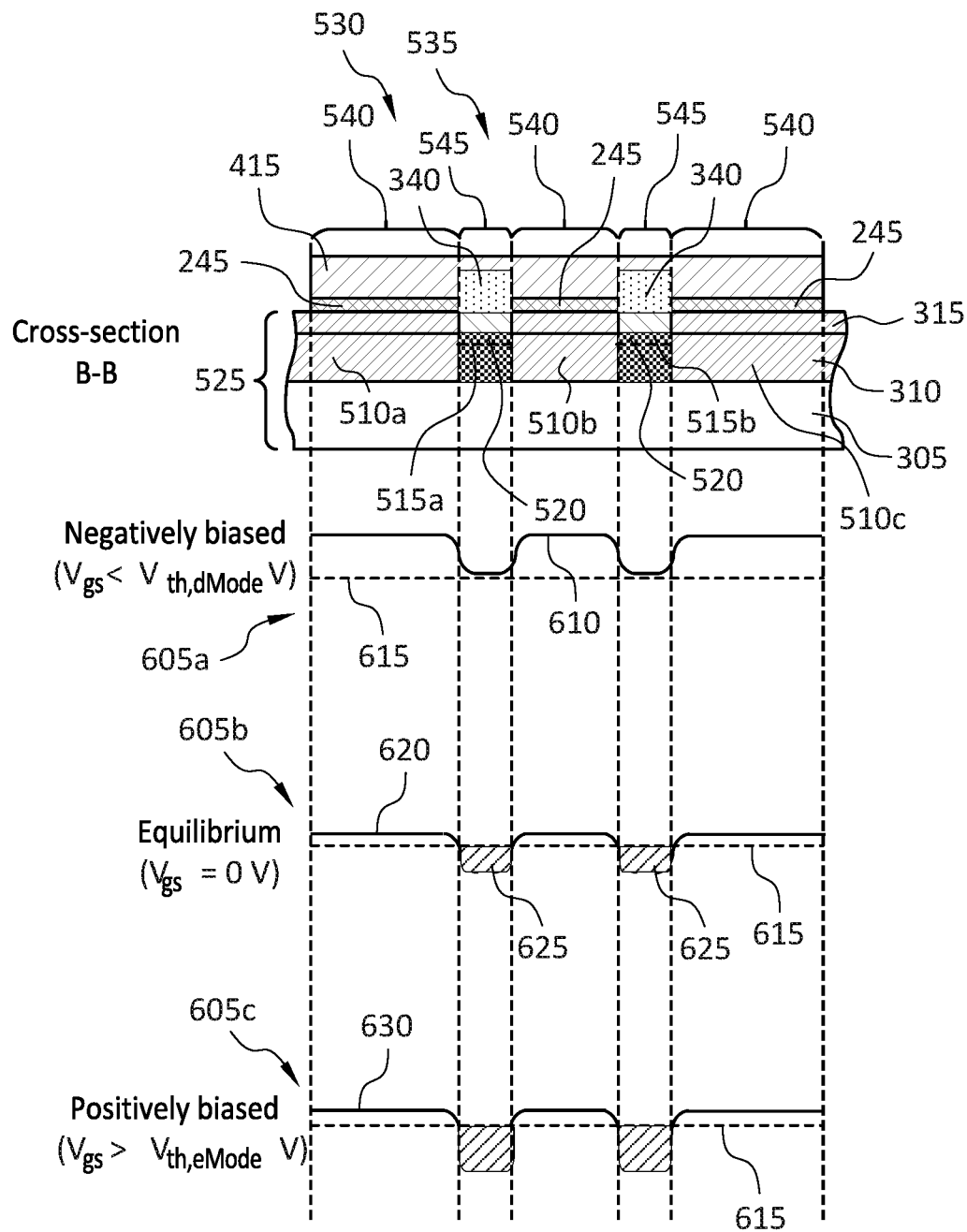
FIG. 6 illustrates a partial cross-sectional view across line B-B of the transistor unit cell illustrated in FIG. 5.

FIG. 6 illustrates a simplified cross-sectional view B-B of gate region 530 of unit cell 500 illustrated in FIG. 5. As shown in FIG. 6, isolation zones 510a, 510b, 510c restrict 2DEG regions 520 to corridors 515a, 515b between the isolation zones.

In some embodiments a drift region control structure 535 can be used to control the flow of electrons within 2DEG regions 520 and can include a plurality of P-type islands 245 that form enhancement-mode devices 540 and spaces between each P-type island that form depletion-mode devices 545, as described in more detail below.

Immediately below cross-section B-B are three graphical depictions of composite conduction band diagrams 605a, 605b, 605c for cross-section B-B. Each band diagram 605a, 605b, 605c represents the state of each enhancement-mode device 540 and of each depletion-mode device 545 at each of three different bias conditions applied between gate electrode 345 and source region 205 (see FIG. 5).

First band diagram 605a illustrates a negative bias condition where a voltage applied between the gate electrode 345 and source region 205 is less than a threshold voltage of depletion-mode devices 340. As shown, a conduction band 610 in the regions of depletion-mode devices 545 are above a fermi level 615, so no electrons can flow through gate region 530. Further, the negative bias on the enhancement-mode devices 540 causes these devices to project a lateral field within corridors 515a, 515b to assist in preventing electron flow in the 2DEG regions 520. As discussed above, isolation zones 510a, 510b, 510c are formed under each P-type island 245 and prevent the flow of electrons in these regions.

Second band diagram 605b illustrates an equilibrium bias condition where a voltage applied between gate electrode 345 and source region 205 is approximately 0 Volts. As shown, conduction band 620 drops below fermi level 615 in the regions of depletion-mode devices 545 creating d-mode potential wells 625 in 2DEG region 520. Electrons are allowed to flow through gate region 530 in the depletion-mode device 545 regions but no electrons are allowed to flow in the enhancement-mode device 540 regions because of isolation zones 510a, 510b, 510c.

Third band diagram 605c illustrates an positive bias condition where a voltage applied between gate electrode 345 and source region 205 is greater than the threshold voltage of the enhancement-mode devices 540. As shown, conduction band 630 drops below fermi level 615 in the regions of depletion-mode devices 545 causing D-mode potential wells 625 to increase, reducing the on-resistance of transistor 505. Further, no E-mode potential wells are created in the regions in-between depletion-mode devices 545 due to isolation zones 510a, 510b, 510c.

In some embodiments the structure described above may result in a threshold voltage of approximately −1 Volts to −25 Volts for transistor 505 due to the combination of the lateral fields from the P-type regions, the vertical fields from the field gate and a reduced charge density from use of the corridors.

Figure 7:
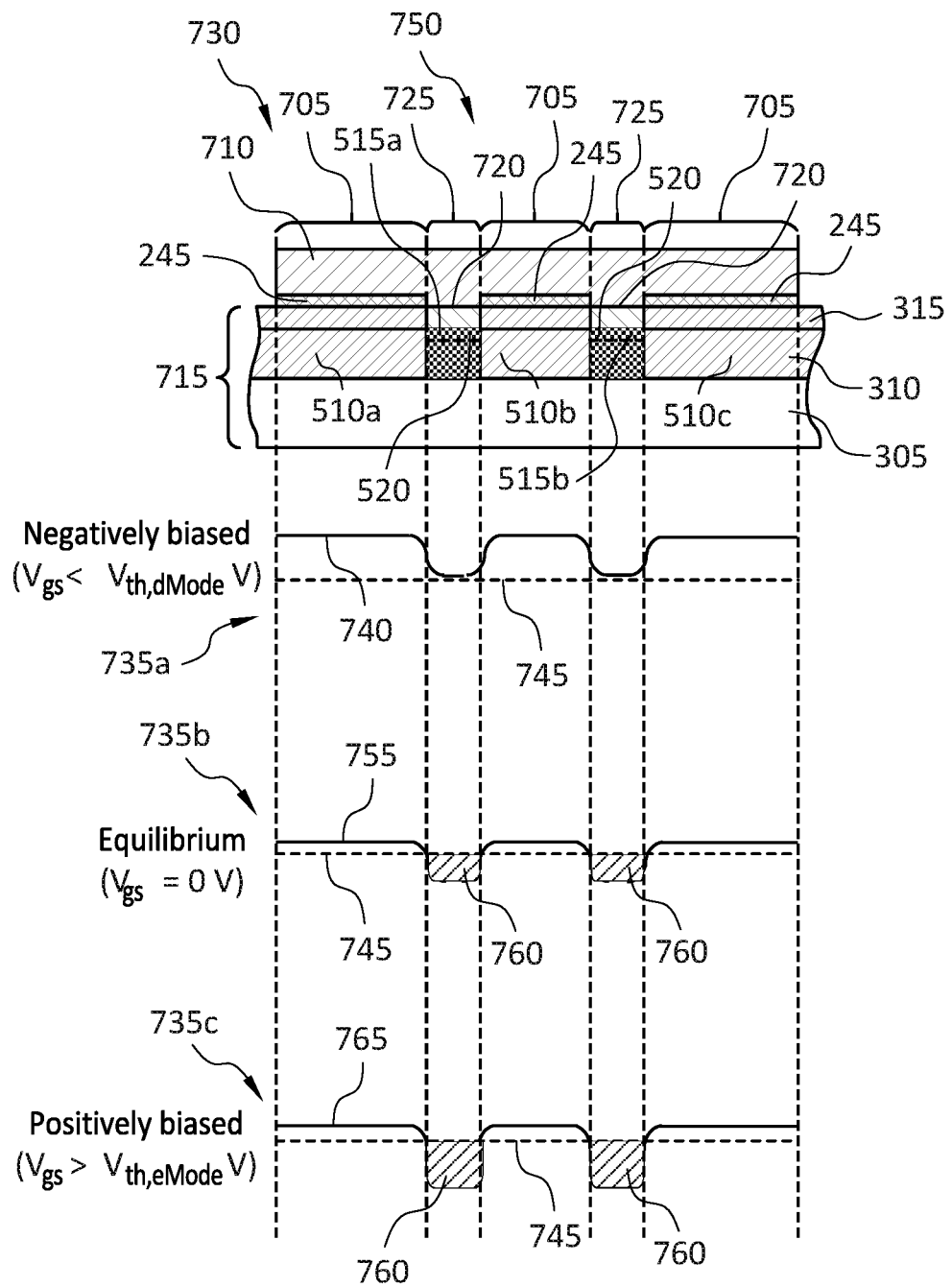
FIG. 7 illustrates a partial cross-sectional view of a transistor unit cell and related composite conduction band diagrams according to an embodiment of the disclosure.

FIG. 7 illustrates a simplified cross-sectional view of another embodiment of a transistor 700 that is similar to transistor 505 illustrated in FIGS. 5 and 6. Transistor 700 is similar to transistor 505 (with like numbers referring to like elements), however in this embodiment transistor 700 does not have dielectric layer 343 and the gate electrode forms a Schottky barrier contact with the substrate.

As shown in FIG. 7, transistor 700 includes P-type islands 245 and a gate electrode 710 that contacts third layer 315 of substrate 715 to form Schottky barrier contacts 720 which form depletion-mode devices 725. As further illustrated, drift region 225 includes isolation zones 510a, 510b, 510c disposed under P-type islands 245, similar to transistor 5 in FIGS. 5 and 6, with like numbers referring to like elements. Therefore, there can be no flow of electrons under P-type islands 245, as described above. In-between drift region isolation zones 510a, 510b, 510c are corridors 515a, 515b that allow electrons to flow through 2DEG region 520, as described in more detail below.

In some embodiments a drift region control structure 730 can be used to control the flow of electrons within 2DEG regions 520 and can include a plurality of P-type islands 245 that form enhancement-mode devices 705 and spaces between each P-type island that form depletion-mode devices 725, as described in more detail below.

Immediately below the cross-section are three graphical depictions of composite conduction band diagrams 735a, 735b, 735c. Each band diagram 735a, 735b, 735c represents the state of each enhancement-mode device 705 and of each depletion-mode device 725 at each of three different bias conditions applied between gate electrode 345 and source region 205 (see FIG. 5).

First band diagram 735a illustrates a negative bias condition where a voltage applied between the gate electrode 345 and source region 205 is less than a threshold voltage of depletion-mode devices 725. As shown, a conduction band 740 in the regions of depletion-mode devices 725 are above a fermi level 745, so no electrons can flow through gate region 750. Further, the negative bias on the enhancement-mode devices 705 causes these devices to project a lateral field within corridors 515a, 515b to assist in preventing electron flow in the 2DEG regions 520. As discussed above, isolation zones 510a, 510b, 510c are formed under each P-type island 245 and prevent the flow of electrons in these regions.

Second band diagram 735b illustrates an equilibrium bias condition where a voltage applied between gate electrode 345 and source region 205 is approximately 0 Volts. As shown, conduction band 755 drops below fermi level 745 in the regions of depletion-mode devices 725 creating d-mode potential wells 760 in 2DEG region 520. Electrons are allowed to flow through gate region 750 in the depletion-mode device 725 regions but no electrons are allowed to flow in the enhancement-mode device 705 regions because of isolation zones 510a, 510b, 510c.

Third band diagram 735c illustrates a positive bias condition where a voltage applied between gate electrode 345 and source region 205 is greater than the threshold voltage of the enhancement-mode devices 705. As shown, conduction band 765 drops further below fermi level 745 in the regions of depletion-mode devices 725 causing d-mode potential wells 760 to increase, reducing the on-resistance of transistor 700. Further, no e-mode potential wells are formed due to isolation zones 510a, 510b, 510c.

In some embodiments the structure described above may result in a threshold voltage of approximately −0.5 Volts to −1.0 Volts for transistor 700 due to the Schottky contacts and barrier. In some embodiments the threshold voltage can vary from less than −1.0 Volts while in other embodiments it can be higher than −0.5 Volts that have different combinations of barrier material, barrier material thicknesses and Schottky metal. In some embodiments a width of each Schottky barrier contact can be in the range of tens of nanometers to several microns, however one of skill in the art will appreciate that other suitable widths can be used and are within the scope of this disclosure. In further embodiments the contact metal for the Schottky barrier is aluminum, however other suitable metals can be used and in other embodiments a dielectric layer can be positioned between the metal and the substrate.

Figure 8:
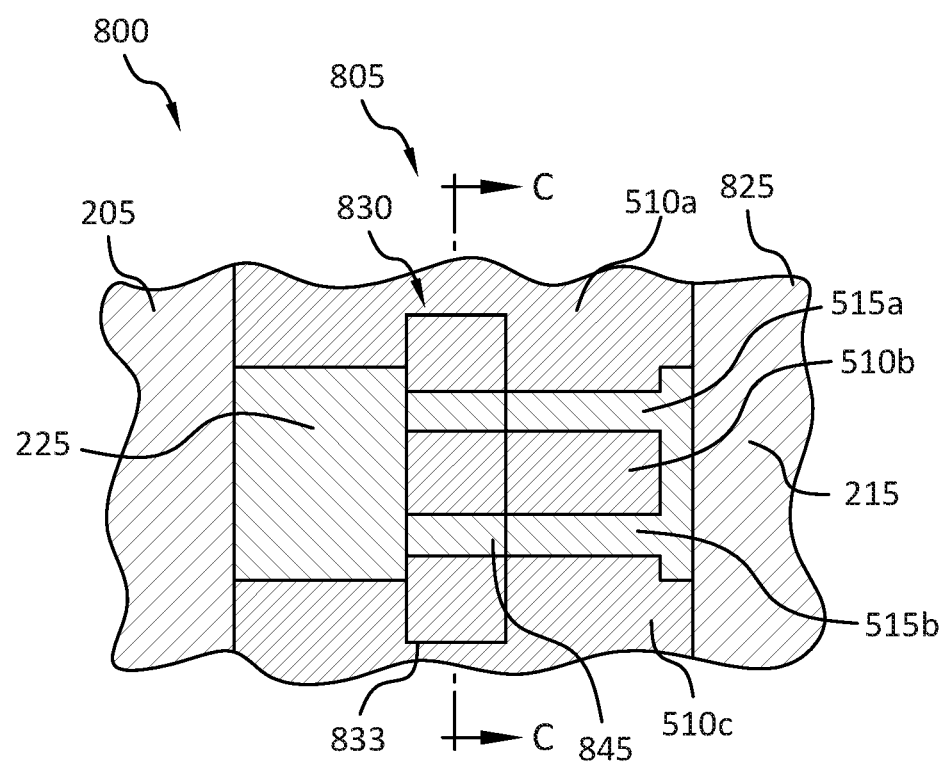
FIG. 8 illustrates a simplified plan view of a transistor unit cell of a GaN-based semiconductor transistor according to an embodiment of the disclosure.

FIG. 8 illustrates a simplified plan view of an example unit cell 800 of a transistor 805 that is similar to transistor 700 illustrated in FIG. 7 (with like numbers referring to like elements), however in this embodiment there are no P-type islands (hence no enhancement-mode devices) and the gate electrode is insulated from the entire substrate by a dielectric layer. Further, similar to transistor 505 in FIGS. 5 and 6, transistor 805 includes isolation zones 510a, 510b, 510c in which no electrons can flow. In-between isolation zones 510a, 510b, 510c are corridors 515a, 515b that allow electrons to flow through 2DEG regions 520, as described in more detail below.

Unit cell 800 includes a semiconductor substrate 825 that includes a source region 205 at a first end, a drain region 215 at a second end and a drift region 225 that extends between the source and drain regions. Drift region 225 is defined by isolation zones 510a, 510c that are disposed on either side of the drift region and extend between source region 205 and drain region 215. A gate region 830 is formed across drift region 225 and is configured to control a flow of electrons through the drift region. Gate region 830 includes a plurality of depletion-mode devices 845 to control the flow of electrons through drift region 225, as described in more detail below.

Figure 9:
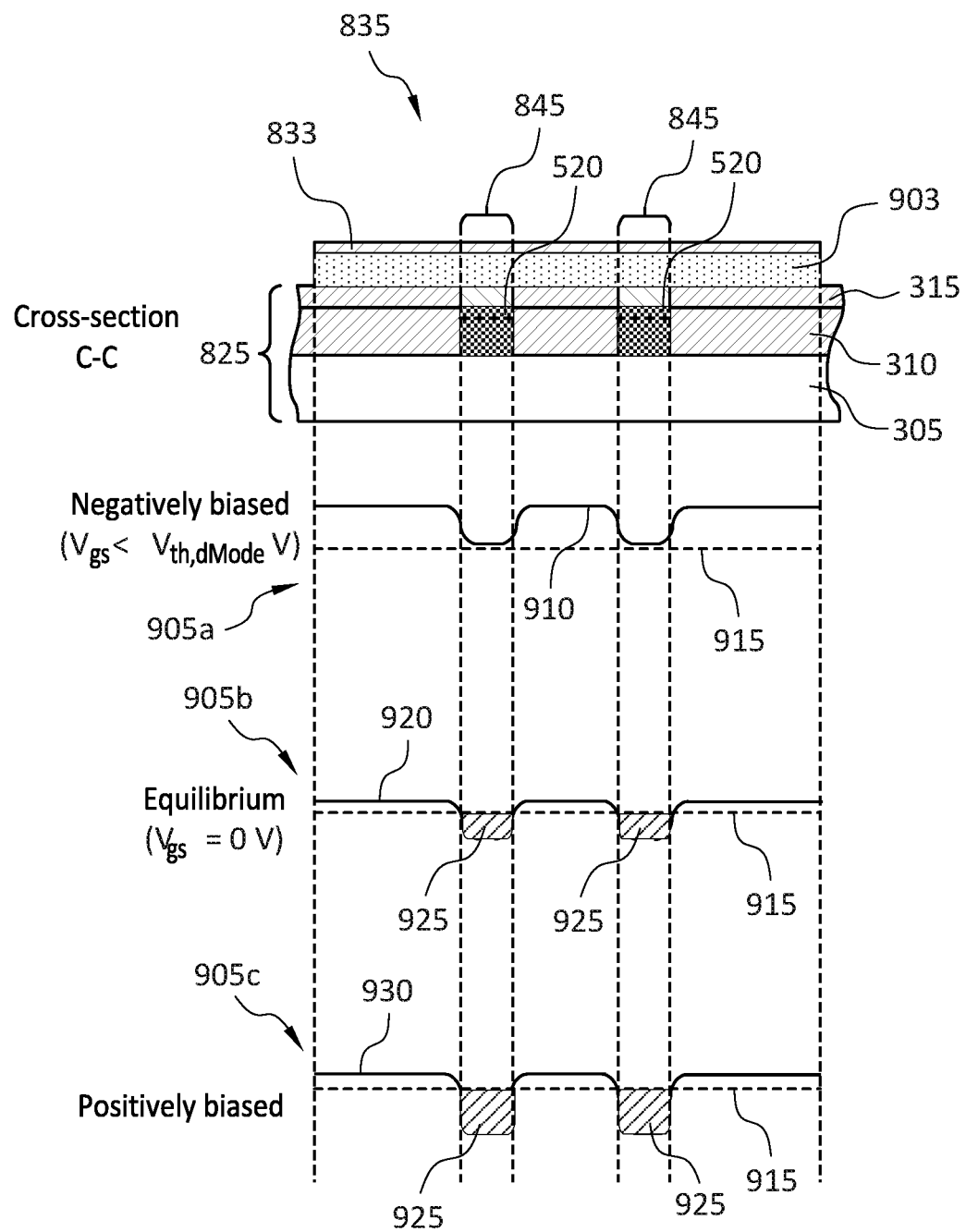
FIG. 9 illustrates a partial cross-sectional view across line C-C of the transistor unit cell illustrated in FIG. 8.

FIG. 9 illustrates a simplified cross-sectional view C-C of gate region 830 of a transistor 805. Isolation zones 510a, 510b, 510c restrict 2DEG regions 520 to corridors 515a, 515b between the isolation zones. A dielectric layer 903 is formed between gate electrode 833 and substrate 825. In some embodiments a drift region control structure 835 can be used to control the flow of electrons within 2DEG regions 520 and can include a plurality of depletion-mode devices 845, as described in more detail below.

Immediately below cross-section C-C are three graphical depictions of composite conduction band diagrams 905a, 905b, 905c for cross-section C-C. Each band diagram 905a, 905b, 905c represents the state of each depletion-mode device 845 at each of three different bias conditions applied between gate electrode 345 and source region 205 (see FIG. 5).

First band diagram 905a illustrates a negative bias condition where a voltage applied between the gate electrode 345 and source region 205 is less than a threshold voltage of depletion-mode devices 845. As shown, a conduction band 910 in the regions of depletion-mode devices 845 are above a fermi level 915, so no electrons can flow through gate region 830. As discussed above, isolation zones 510a, 510b, 510c are formed within drift region 225 and prevent the flow of electrons in these regions.

Second band diagram 905b illustrates an equilibrium bias condition where a voltage applied between gate electrode 345 and source region 205 is approximately 0 Volts. As shown, conduction band 920 drops below fermi level 915 in the regions of depletion-mode devices 845 creating d-mode potential wells 925 in 2DEG region 520. Electrons are allowed to flow through gate region 830 in the depletion-mode device 845 regions but no electrons are allowed to flow in isolation zones 510a, 510b, 510c.

Third band diagram 905c illustrates a positive bias condition where a positive voltage is applied between gate electrode 345 and source region 205. As shown, conduction band 930 drops further below fermi level 915 in the regions of depletion-mode devices 845 causing d-mode potential wells 925 to deepen, reducing the on-resistance of transistor 805.

In some embodiments the structure described above may result in a threshold voltage of approximately −1 Volts to −20 Volts for transistor 900 due to the combination of the vertical field from the field gate and a reduced charge density from use of the corridors.

Figure 10:
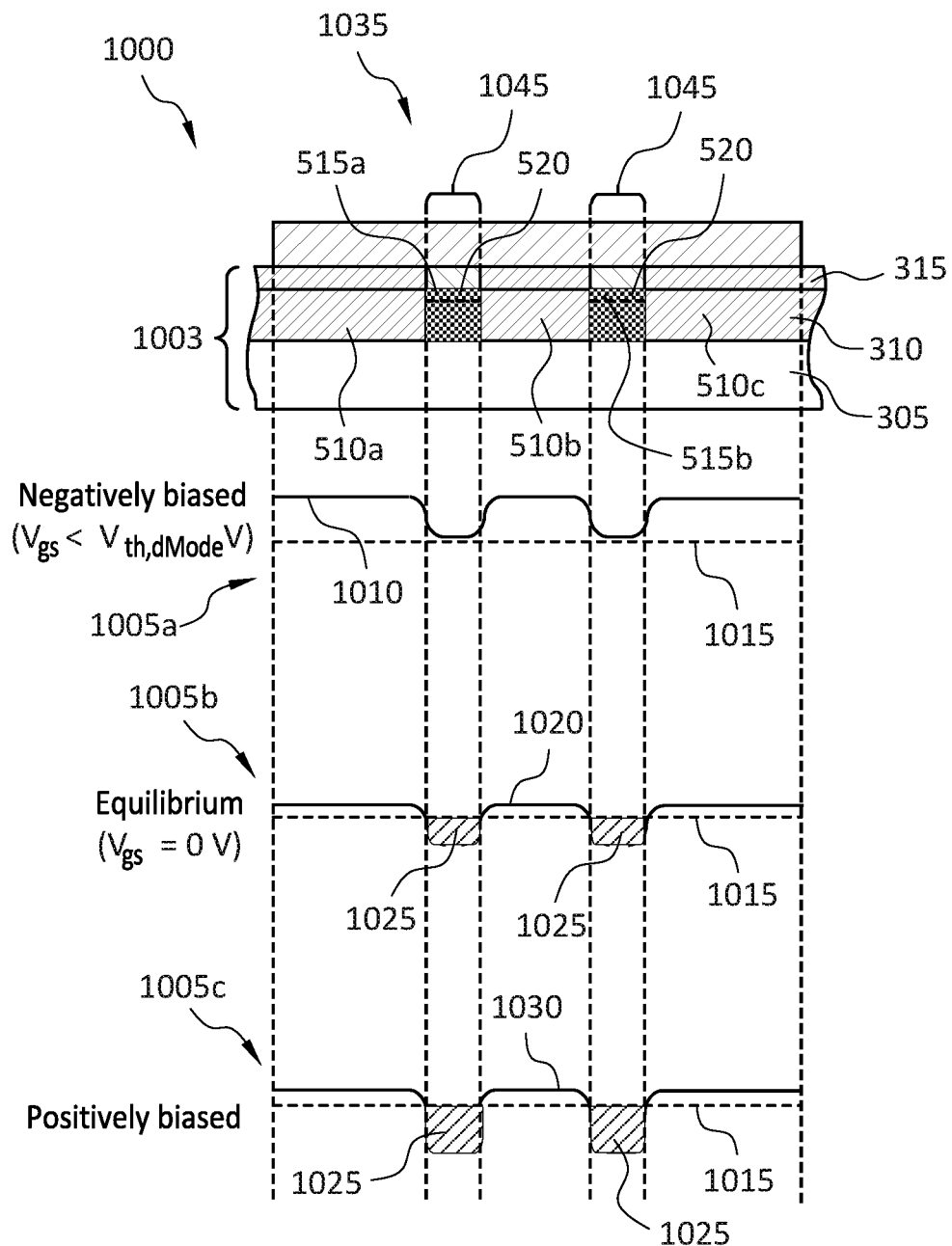
FIG. 10 illustrates a partial cross-sectional view of a transistor unit cell and related composite conduction band diagrams according to an embodiment of the disclosure.

FIG. 10 illustrates a simplified cross-sectional view of another embodiment of a transistor 1000 that is similar to transistor 805 illustrated in FIGS. 8 and 9 (with like numbers referring to like elements), however in this embodiment transistor 1000 does not have dielectric layer 903 and the gate electrode forms a Schottky barrier contact with the substrate 1003.

Isolation zones 510a, 510b, 510c restrict 2DEG regions 520 to corridors 515a, 515b between the isolation zones. In some embodiments a drift region control structure 1035 can be used to control the flow of electrons within 2DEG regions 520 and can include a plurality of depletion-mode devices 1045, as described in more detail below.

Immediately below the cross-section are three graphical depictions of composite conduction band diagrams 1005a, 1005b, 1005c for cross-section C-C. Each band diagram 1005a, 1005b, 1005c represents the state of each depletion-mode device 1045 at each of three different bias conditions applied between gate electrode 345 and source region 205.

First band diagram 1005a illustrates a negative bias condition where a voltage applied between the gate electrode 345 and source region 205 is less than a threshold voltage of depletion-mode devices 1045. As shown, a conduction band 1010 in the regions of depletion-mode devices 1045 are above a fermi level 1015, so no electrons can flow through the gate region. As discussed above, isolation zones 510a, 510b, 510c are formed within drift region 225 and prevent the flow of electrons in these regions.

Second band diagram 1005b illustrates an equilibrium bias condition where a voltage applied between gate electrode 345 and source region 205 is approximately 0 Volts. As shown, conduction band 1020 drops below fermi level 1015 in the regions of depletion-mode devices 1045 creating d-mode potential wells 1025 in 2DEG region 520. Electrons are allowed to flow through gate region 1035 in the depletion-mode device 1045 regions but no electrons are allowed to flow in isolation zones 510a, 510b, 510c.

Third band diagram 1005c illustrates a positive bias condition where a positive voltage is applied between gate electrode 345 and source region 205. As shown, conduction band 1030 drops further below fermi level 1015 in the regions of depletion-mode devices 1045 causing d-mode potential wells 1025 to deepen, reducing the on-resistance of transistor 1000.

In some embodiments the structure described above may result in a threshold voltage of approximately −0.5 Volts to −1.0 Volts for transistor 1000 due to the Schottky contacts and barrier. In some embodiments the threshold voltage can vary from lower than −1.0 Volts and in other embodiments to higher than −0.5 Volts that have different combinations of barrier material, barrier thickness and Schottky metal. In some embodiments a width of each Schottky barrier contact can be in the range of tens of nanometers to several microns, however one of skill in the art will appreciate that other suitable widths can be used and are within the scope of this disclosure. In further embodiments the contact metal for the Schottky barrier is aluminum, however other suitable metals can be used and in other embodiments a dielectric layer can be positioned between the metal and the substrate.

Figure 11:
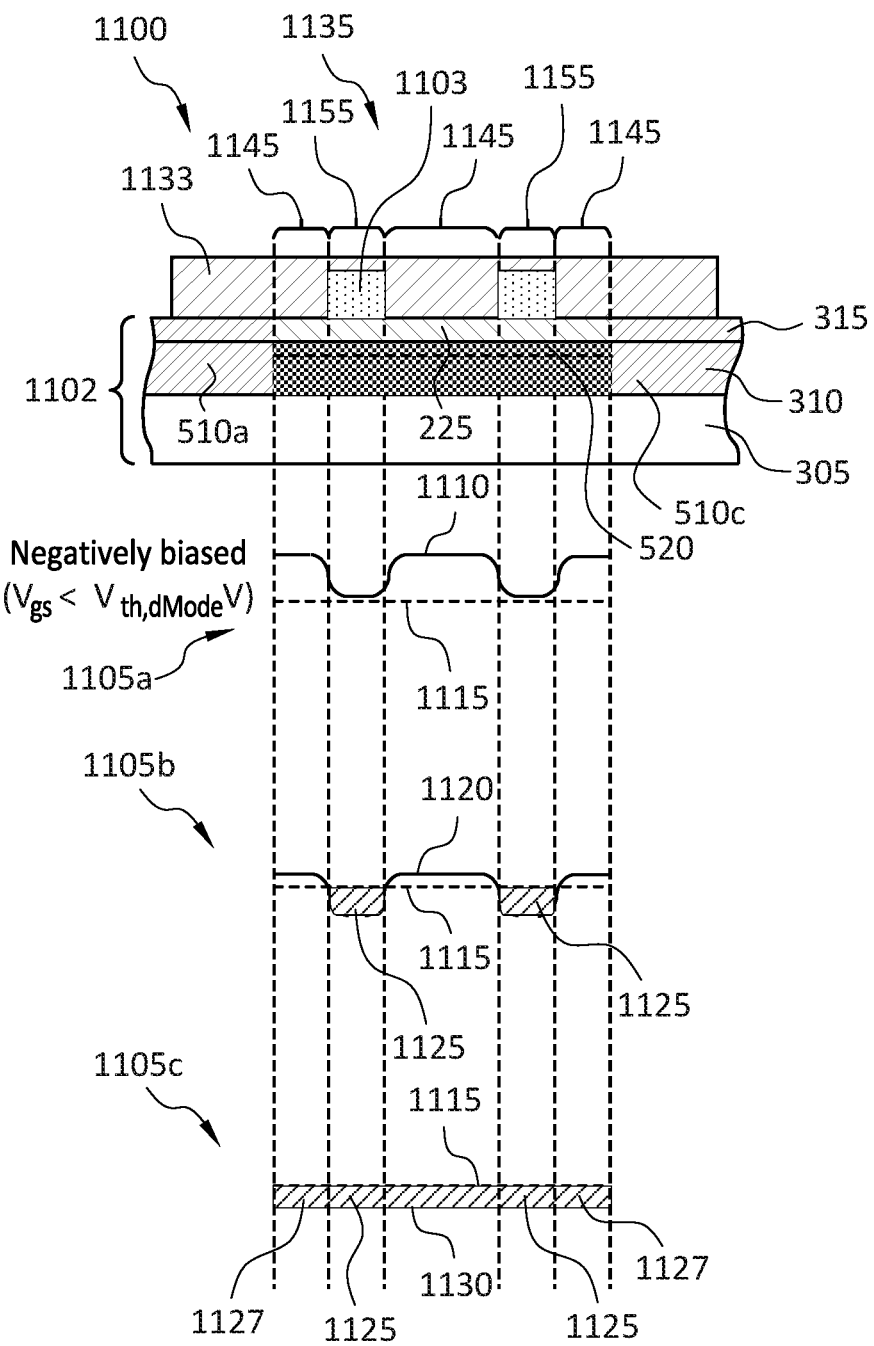
FIG. 11 illustrates a partial cross-sectional view of a transistor unit cell and related composite conduction band diagrams according to an embodiment of the disclosure.

FIG. 11 illustrates a simplified cross-sectional view of another embodiment of a transistor 1100 that is similar to transistor 1000 illustrated in FIG. 10 (with like numbers referring to like elements), however in this embodiment transistor 1100 includes dielectric regions formed on portions of the substrate and the only isolation zones are located on either side of the drift region, not within the drift region.

More specifically, isolation zones 510a, 510c are disposed on either side of drift region 225. Dielectric regions 1103 are formed on third layer 315 of substrate 1102 and gate electrode 1133 is formed over the dielectric regions and is in contact with third layer 315 of substrate 1102. In some embodiments a drift region control structure can be used to control the flow of electrons within 2DEG region 520 and can include a plurality of depletion-mode (Metal-Insulator-Semiconductor) MIS-HEMT devices 1145 located under dielectric regions 1103 and depletion-mode (Metal Semiconductor) MS-HEMT devices 1155 in-between and outside of the dielectric regions, as described in more detail below.

Immediately below the cross-section are three graphical depictions of composite conduction band diagrams 1105a, 1105b, 1105c. Each band diagram 1105a, 1105b, 1105c represents the state of each depletion-mode device 1145, 1155 at each of three different bias conditions applied between gate electrode 345 and source region 205.

First band diagram 1105a illustrates a negative bias condition where a voltage applied between the gate electrode 345 and source region 205 is less than a threshold voltage of depletion-mode MIS-HEMT devices 1145. As shown, a conduction band 1110 in the regions of depletion-mode MIS-HEMT devices 1145 are above a fermi level 1115, so no electrons can flow through gate region 1135. Similarly, conduction band 1110 in the regions of depletion-mode MS-HEMT devices 1155 are above the fermi level 1115, so no electrons can flow through gate region 1135.

Second band diagram 1105b illustrates a less negative bias condition where a voltage applied between gate electrode 345 and source region 205 is greater than the threshold voltage of depletion-mode MIS-HEMT but less than the threshold voltage of depletion-mode MS-HEMT. As shown, conduction band 1120 drops below fermi level 1115 in the regions of depletion-mode MIS-HEMT devices 1125 creating d-mode MIS-HEMT potential wells 1125 in 2DEG region 520. Electrons are allowed to flow through the gate region in the depletion-mode MIS-HEMT device 1125 regions.

Third band diagram 1105c illustrates an equilibrium bias condition where a voltage is applied between gate electrode 345 and source region 205 is approximately 0 Volts. As shown, conduction band 1130 drops below fermi level 1115 in the regions of depletion-mode MIS-HEMT devices 1145 and in the regions of depletion-mode MS-HEMT devices 1155 creating MS-HEMT potential wells 1127, reducing the on-resistance of transistor 1100.

Figure 12:
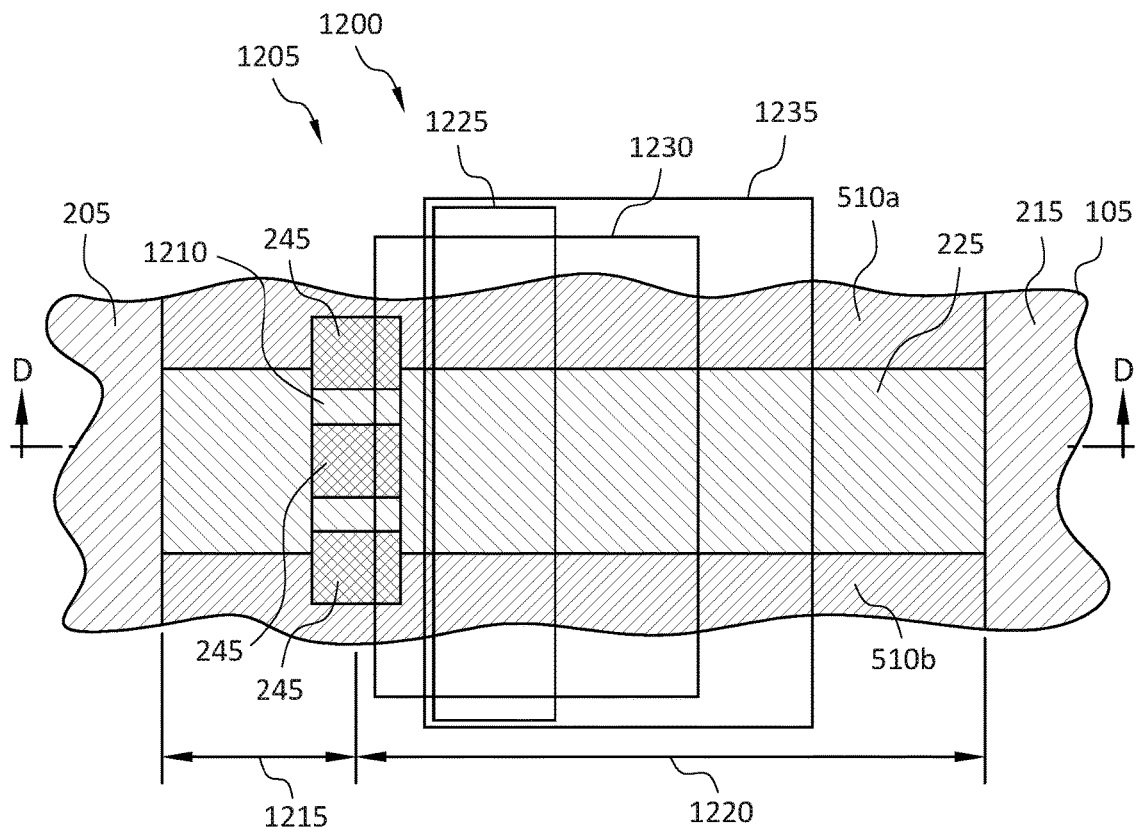
FIG. 12 illustrates a simplified plan view of an asymmetric transistor unit cell of a GaN-based transistor including field plates, according to an embodiment of the disclosure.

FIG. 12 illustrates a simplified plan view of an example unit cell 1200 of transistor 1205 that is similar to transistor 100 illustrated in FIGS. 1-3C (with like numbers referring to like elements), however transistor 1205 is asymmetric and includes a plurality of field plates, that may improve the performance of transistor 1205 at high voltages, as described in more detail below.

As shown in FIG. 12, transistor 1205 includes substrate 105 that includes a source region 205 at a first end, a drain region 215 at a second end and a drift region 225 that extends between the source and drain regions. Drift region 225 is defined by isolation zones 510a, 510b that are disposed on either side of the drift region and extend between source region 205 and drain region 215. A gate region 1210 is formed across drift region 225 (in a perpendicular orientation relative to the drift region) and is configured to control a flow of electrons through the drift region.

In this embodiment gate region 1210 is placed off-center within drift region 225. More specifically, gate region 1210 is a first distance 1215 from source region 205 and a second distance 1220 from drain region 215 where the first distance is less than the second distance so the geometry is asymmetric. In certain embodiments the larger second distance 1220 enables transistor 1205 to withstand higher applied voltages between source region 205 and drain region 215.

Transistor 1205 also includes field plates 1225, 1230, 1235 that can be metal plates formed on layers above substrate 105 and that are biased to apply a voltage bias across drift region 225 in a region between gate region 1210 and drain region 215. Any number and configuration of field plates can be used, including plates near drain region that are coupled to the drain terminal.

Figure 13:
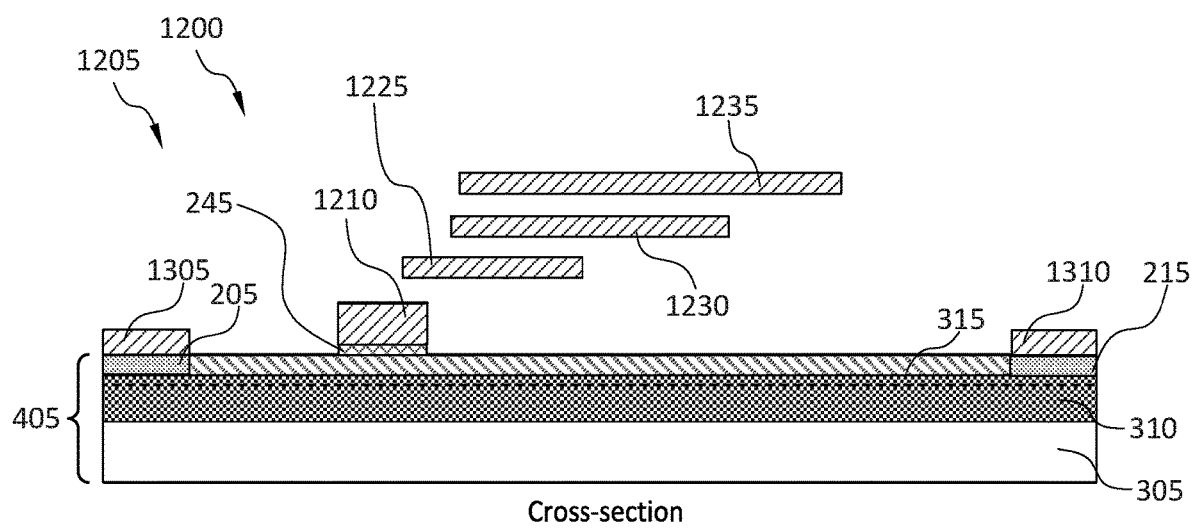
FIG. 13 illustrates a simplified partial cross-sectional view of the unit cell shown in FIG. 12.

FIG. 13 illustrates a simplified cross-section D-D of transistor 1205 illustrated in FIG. 12. As shown in FIG. 13 field plates 1225, 1230, 1235 extend from the gate region 1210 towards the drain region 215. As appreciated by one of skill in the art, field plates 1225, 1230, 1235 can have any suitable thickness, length or width and any number of dielectric layers can be formed within transistor 1205 to electrically isolate field plates 1225, 1230, 1235 from one another or for any other purpose. Also shown in FIG. 13 are source electrode 1305 that is positioned over source regions 205 and drain electrode 1310 that is positioned over drain region 215.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A transistor comprising:
   a compound semiconductor substrate;
   a source region formed in the substrate;

a drain region formed in the substrate and separated from the source region;

a two-dimensional electron gas (2DEG) layer formed in the substrate and extending continuously from the source region to the drain region in a first direction, and extending between a first isolation region and a second isolation region in a second direction that is perpendicular to the first direction; and a gate region formed across the 2DEG layer and including at least one depletion-mode structure and at least one enhancement-mode structure arranged sequentially in the second direction.

2. The transistor of claim 1 wherein the at least one enhancement-mode structure includes a p-type layer.

3. The transistor of claim 2 wherein the gate region includes a plurality of depletion-mode structures and a plurality of enhancement-mode structures with each enhancement-mode structure including a separate p-type layer.

4. The transistor of claim 3 wherein the plurality of depletion-mode structures and the plurality of enhancement-mode structures are arranged across the 2DEG layer in an alternating sequence.

5. The transistor of claim 4 further comprising a gate electrode that is electrically coupled to each separate p-type layer of each enhancement-mode structure of the plurality of enhancement-mode structures, and is electrically insulated from the 2DEG layer of each depletion-mode structure of the plurality of depletion-mode structures.

6. The transistor of claim 4 further comprising a gate electrode that is electrically coupled to each separate p-type layer of each enhancement-mode structure of the plurality of enhancement-mode structures, and is electrically coupled to a drift region of the substrate of each depletion-mode structure of the plurality of depletion-mode structures forming a Schottky barrier.

7. The transistor of claim 1 wherein one or more field plates are formed over a drift region and extend from the gate region towards the drain region.

8. The transistor of claim 1 wherein a threshold voltage for the transistor is between −10 Volts and −25 Volts.

9. A transistor comprising:
a compound semiconductor substrate;
a source region formed in the substrate;
a drain region formed in the substrate and separated from the source region in a first direction;
a two dimensional electron gas (2DEG) layer extending continuously from the source region to the drain region; and
a gate region formed across the 2DEG layer and positioned between the source region and the drain region, the gate region including at least one depletion-mode device and at least one enhancement-mode device arranged sequentially in a second direction that is orthogonal to the first direction.

10. The transistor of claim 9 further comprising a gate electrode that extends across the gate region.

11. The transistor of claim 10 wherein the gate region includes a plurality of enhancement-mode devices and wherein each enhancement-mode device of the plurality of enhancement-mode devices includes a p-type layer that is coupled to the gate electrode.

12. The transistor of claim 11 wherein the gate region includes a plurality of depletion-mode devices, each depletion-mode device of the plurality of depletion-mode devices positioned in-between two enhancement-mode devices such that the plurality of depletion-mode devices and the plurality of enhancement-mode devices are arranged in an alternating pattern.

13. The transistor of claim 12 wherein the gate electrode is electrically coupled to each p-type layer of each enhancement-mode device of the plurality of enhancement-mode devices and is electrically insulated from each depletion-mode device of the plurality of depletion-mode devices by a dielectric layer.

14. The transistor of claim 12 wherein the gate electrode is electrically coupled to each p-type layer of each enhancement-mode device and is electrically coupled to each depletion-mode device to form a Schottky barrier.

15. The transistor of claim 9 wherein one or more field plates are formed over a drift region and extend from the gate region towards the drain region.

16. A compound semiconductor transistor comprising:
a substrate;
a source formed in the substrate;
a drain formed in the substrate and separated from the source along a first direction;
a two dimensional electron gas (2DEG) layer extending continuously from the source to the drain; and
a gate formed across the 2DEG layer and positioned between the source and the drain, the gate including a plurality of depletion-mode devices and a plurality of enhancement-mode devices arranged in a second direction that is orthogonal to the first direction and parallel to the substrate.

17. The transistor of claim 16 wherein each enhancement-mode device of the plurality of enhancement-mode devices includes a p-type layer.

18. The transistor of claim 17 wherein the plurality of enhancement-mode devices and the plurality of depletion-mode devices are arranged in an alternating pattern having an enhancement-mode device positioned in-between two adjacent depletion-mode devices.

19. The transistor of claim 17 further comprising a gate electrode that is electrically coupled to the p-type layer of each enhancement-mode device of the plurality of enhancement-mode devices, the gate electrode electrically coupled to the substrate in a region of each depletion-mode device of the plurality of depletion-mode devices to form a plurality of Schottky barriers.

* * * * *